(12) United States Patent
Wasilousky et al.

(10) Patent No.: US 6,870,658 B2
(45) Date of Patent: Mar. 22, 2005

(54) ENERGY LIMITER FOR AMPLITUDE MODULATED RF WAVEFORMS

(75) Inventors: Peter Alan Wasilousky, Indialantic, FL (US); Robert Morris Montgomery, Indialantic, FL (US); Pat O. Bentley, West Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 112 days.

(21) Appl. No.: 10/462,552

(22) Filed: Jun. 16, 2003

(65) Prior Publication Data

US 2004/0252359 A1 Dec. 16, 2004

(51) Int. Cl.⁷ .................................................. G02F 1/11
(52) U.S. Cl. ...................................... 359/285; 359/239
(58) Field of Search ................................ 359/285, 237, 359/239, 249, 305, 307

(56) References Cited

U.S. PATENT DOCUMENTS 5,929,704 A * 7/1999 Proctor et al. .............. 330/149
6,301,399 B1 * 10/2001 Mahapatra et al. ............ 385/2

* cited by examiner

*Primary Examiner*—Scott J. Sugarman
*Assistant Examiner*—Richard Hanig
(74) *Attorney, Agent, or Firm*—Allen, Dyer, Doppelt, Milbrath & Gilchrist, P.A.

(57) ABSTRACT

An RF power controller arrangement prevents excessive RF power-based thermal loading of an RF signal processing device, such an as acousto-optic modulator, by controllably constraining the product of the average on-duration of a baseband modulation signal and RF input power to realize no more than a prescribed value of RF energy supplied to the modulator.

14 Claims, 1 Drawing Sheet

US 6,870,658 B2

ENERGY LIMITER FOR AMPLITUDE MODULATED RF WAVEFORMS

FIELD OF THE INVENTION

The present invention relates in general to signal processing systems and components therefor, and is particularly directed to a new and improved apparatus and method for preventing excessive RF power-based thermal loading of an RF signal processing device, such an as acousto-optic modulator.

BACKGROUND OF THE INVENTION

Many RF signal processing applications require that an amplitude modulated RF signal be applied to a load, such as, but not limited to an acousto-optic modulator, whose known power handling capabilities may be exceeded under conditions where the total energy delivered in a given period of time may cause damage to the device. For the most part, damage may be attributable to excessive heat generation, which must not be permitted to exceed a maximum safe level in order to ensure proper operation of the device. At the same time, the instantaneous power level delivered to the load may be quite large, as in the case of intermittent pulse radar or low duty cycle drive requirements for certain acousto-optic modulator (AOM) applications.

In a typical AOM application, a reduced complexity diagram of which is illustrated in FIG. 1, a source of RF carrier power is coupled by way of an RF input port 11 to an input gain stage 12. The output of the input RF gain stage is coupled by way of a variable gain attenuator or amplifier (VGA) 13 to a first, RF carrier input port 14 of an amplitude modulator stage 15. Amplitude modulator stage 15 has a second, baseband input port 16 to which a baseband modulation signal Vam is supplied. The output of the baseband modulator 15 produces a modulated RF signal which is amplified in a main RF power amplifier 17 and then applied to an output device or load, such as an acousto-optic modulator 18. If the baseband signal Vam is not controlled by the user in such a manner as to limit the amount of RF energy delivered to the load within a given time interval (i.e., in a manner effectively limiting the average RF power level over that interval), damage to the load may occur.

Conventional approaches for limiting RF power rely on direct measurement of the instantaneous modulated RF envelope being supplied to the load, with post integration of the detected RF power level. Post integration is most often performed by means of a low pass filter network, whose output depends on the impedance of the RF power detector and the baseband spectrum, both of which contribute to reduced output with very short duration pulses (e.g., less than ten nanoseconds). As these approaches are expensive, there is a need for a more 'practical' (i.e. cost effective) mechanism for limiting RF output power to safe levels, that will not induce thermal overload in the output device.

Theory of Operation

Referring to FIG. 1, let the source RF carrier power level of $RF_{in}$ be given by $P_{in}$. Further let $G_A$ be the product of all constant RF gain sources in the RF signal path, with variable gain $G_V$ from a variable gain attenuator or amplifier, and a gain $G_M$ associated with the RF modulator. Then the total output energy $E_o$ supplied to the load in a time $\tau$ is given by:

$$E_o = \int_0^\tau P_o(t)\,dt \qquad (E.1)$$

where $P_o(t)$, the instantaneous output power delivered to the load, is just the product of $P_{in}$ and the total gain. Rewriting (E.1) in terms of the product gains gives:

$$E_o = G_A \cdot G_V \cdot P_{in} \int_0^\tau G_M(t)\,dt \qquad (E.2)$$

Further, if $G_M(t)$ and $V_{AM}(t)$ are related to within a suitable scaling constant and offset, ie. a linear relationship exists between the two, then ignoring the offset:

$$G_M(t) = \kappa \cdot V_{AM}(t) \qquad (E.3)$$

and, $$\kappa \cdot \int_0^\tau V_{AM}(t)\,dt = \int_0^\tau G_M(t)\,dt \qquad (E.5)$$

The leftmost integral may be determined directly in any circuit application by use of a simple analog video integrator, where the output voltage from the integrator $V_o$ is given by:

$$V_o = -\frac{A_V}{\tau_o} \cdot \int_0^\tau V_{AM}(t)\,dt = C1 \cdot \int_0^\tau V_{AM}\,dt \qquad (E.5)$$

with a suitable video scaling constant Av applied, where $\tau_0 = R \cdot C$ is the integrator time constant, given by the product of the input resistance R and feedback capacitance C. Note there are no restrictions placed on the form of $V_{AM}(t)$, other than its suitability for application to a video integrator. From (E.4) and (E.5) we obtain the result:

$$\frac{\kappa}{C1} \cdot V_o = \int_0^\tau G_M(t)\,dt \qquad (E.6)$$

Correspondingly, if $G_M(t) = G_{max}$ is constant over the integration period $\tau$, where $G_{max}$ represents the maximum gain associated with the modulator, then:

$$\frac{\kappa}{C1} \cdot V_{max} = \int_0^\tau G_{max}\,dt = G_{max} \cdot \tau \qquad (E.7)$$

where $V_{max}$ represents the maximum extrapolated output voltage which the integrator would produce. Dividing both sides of (E.2) by the integration period $\tau$, gives the result:

$$P_{ave} = G_A \cdot G_V \cdot P_{in} \cdot \frac{1}{\tau}\int_0^\tau G_M(t)\,dt = G_A \cdot G_V \cdot P_{in} \cdot \langle G_M(t)\rangle \qquad (E.8)$$

where $P_{ave}$ is the average output power delivered to the load during the integration period, and $\langle G_M(t)\rangle$ is the time average gain of the modulator over the same time interval. Using (E.6) and (E.7), we can express this result in terms of the integrator output voltages as:

$$P_{ave} = G_A \cdot G_V \cdot G_{max} \cdot P_{in} \cdot \left(\frac{V_o}{V_{max}}\right) \quad \text{(E. 9)}$$

This is the key result as applied to the current claim, wherein a simple circuit concept is proposed which, utilizes the established gain values for $G_A$, $G_V$, $G_{max}$ and $V_{max}$, measures Pin and performs the necessary integration of the modulation signal in order to set $P_{ave}$ to a safe operating level.

By way of example, we take the case of simple pulse modulation, where we have the following conditions:

$$G_M(t); V_{AM}(t) = G_M; V' \quad \text{for} \quad V_i \geq V_{th} \quad \text{(E. 10)}$$
$$0; 0 \quad \text{for} \quad V_i < V_{th}$$

where the value of the modulating voltage is V', for an input control voltage $V_i$ which exceeds a logic threshold, and zero otherwise. Then (E.8) gives;

$$P_o = G_A \cdot G_V \cdot G_M \cdot P_{in} \cdot \left(\frac{\tau_{on}}{\tau}\right) \quad \text{(E. 11)}$$

where $\tau_{on}$ is the total "on" time of the modulator during the integration interval $\tau$, during which it exhibits a maximum constant gain $G_M$. By performing the corresponding video integration of the modulating voltage as expressed by (E.6) and (E.7), we obtain the result;

$$\frac{\tau_{on}}{\tau} = \frac{V_o}{V_{max}} \quad \text{(E. 12)}$$

which upon substitution in (E.11) produces the same results given by (E. 9) for the general case. The approach to providing a low cost energy limiting function which fully exploits the results of the theory described, forms the basis for the present invention.

SUMMARY OF THE INVENTION

In accordance with the present invention, this objective is successfully addressed by a low cost, pre-modulation protection circuit, which performs measurements on the RF and modulation signal transport paths, and then limits the total output RF energy delivered to the load, in a manner that is fundamentally insensitive to RF pulse duration on-time and duty cycle, while permitting the use of low cost monolithic RF detector integrated circuits. As in the architecture of FIG. 1, the invention has an RF input port coupled to a variable gain stage. This stage is operative under supervisory microcontroller control to impart a prescribed amount of attenuation or gain to the input RF carrier.

The output of the variable gain stage is coupled to each of a baseband modulator and an RF power detector. The baseband modulator is coupled to receive a baseband amplitude modulation signal and has its output coupled to a main RF power amplifier which drives an output load, such as an acousto-optic modulator. The RF power detector outputs a value representative of the power of the RF carrier signal being supplied to the baseband modulator so as establish the instantaneous power level at a maximum output level. This monitored RF power value is coupled to the microcontroller and is used in conjunction with the baseband modulation signal to controllably constrain the RF output power delivered to the load.

For this purpose, the baseband modulation signal is coupled to a dual integrator unit which integrates the baseband modulation signal over a prescribed integration interval ($\tau$), in order to determine the average modulator gain produced by the baseband signal Vam(t). The use of a pair of precision integrators within the dual integrator unit, whose integration and reset times are controlled by the microcontroller, allows 'ping-pong' operation, to ensure continuous monitoring of the average modulator gain, and provides a pulse width and duty cycle insensitive mechanism for measuring the average power of the output waveform.

The output level from the RF power detector is digitized by the microcontroller to establish an appropriate average modulator gain threshold voltage from the integrators under which safe output conditions are allowable. The values for these thresholds may be stored in memory, and are compared to the average value of the digitized output from the dual integrator unit. Knowing the nominal parameters of the baseband modulation signal enables the microcontroller to determine from the output of the integrator the average modulator gain produced by the baseband signal. Whenever the allowable average modulator gain threshold is exceeded for a given RF level, the microcontroller takes the appropriate action to either reduce the amplifier gain or inhibit modulation input.

Namely, assuming that maximum RF carrier power is applied to the load for the entirety of the on-time of the baseband modulation waveform there is an associated maximum RF carrier power that can safely be coupled to the load. The longer the average on time of the baseband signal, the smaller the value of RF power that can be applied to the load without causing damage or degradation of its properties. Conversely, where the average on time of the amplitude modulation signal is relatively short (e.g., a very narrow RF pulse), the load is able to handle a much higher value of RF power.

The problem to be avoided is not peak RF power, but total energy. An RF load device, such as an acousto-optic modulator, can handle a very narrow pulse (e.g., several nanoseconds) of very high amplitude RF power, whereas applying such a large value of RF power over a longer period of time would entail the application of a relatively large average amount and therefore destructive value of energy. In order to ensure that the load is never presented with an unacceptably large quantity of energy, the present invention establishes the average RF power in accordance with the average modulator gain produced by the baseband signal.

DETAILED DESCRIPTION

Figure 1:
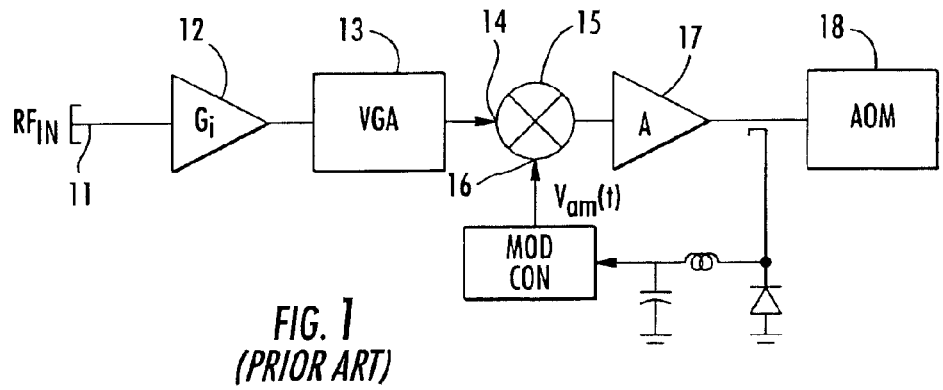
FIG. 1 diagrammatically illustrates a conventional RF signal processing path through an acousto-optic modulator.

Before describing in detail the new and improved RF energy limiting mechanism in accordance with the present invention, it should be observed that the invention resides primarily in what is effectively a prescribed arrangement of conventional RF signal processing circuits and components therefor. Thus, the configurations of such circuits and components and the manner in which they are interfaced with other RF system and baseband components have, for the most part, been illustrated in the drawings in readily understandable block diagram format, so as to show only those specific details that are pertinent to the present invention, and not to obscure the disclosure with details which will be readily apparent to those skilled in the art having the benefit of the description herein, and are primarily intended to show the major components of the system in a convenient functional grouping, whereby the present invention may be more readily understood.

Figure 2:
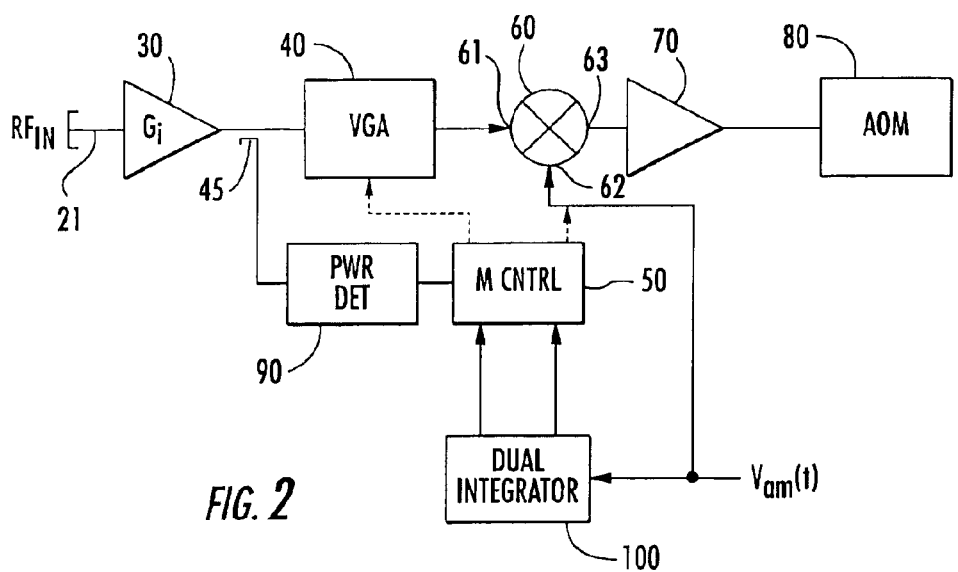
FIG. 2 diagrammatically illustrates an apparatus embodying the pre-AOM RF energy-limiting mechanism of the present invention.

Referring now to FIG. 2, an apparatus embodying the pre-modulator RF energy-limiting mechanism of the present invention is shown diagrammatically as comprising an RF input port 21 to which an RF carrier frequency is applied. As in the architecture of FIG. 1, RF input port 21 is coupled by way of an input gain stage 30 to a variable gain (VGA) stage 40. Under control of a supervisory microcontroller 50, the variable gain stage 40 is operative to impart a prescribed amount of attenuation or gain to the input RF carrier in accordance with a digital control signal applied thereto by microcontroller 50.

Figure 3:
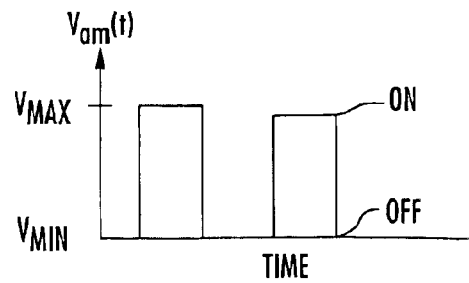
FIG. 3 shows a baseband modulation signal Vam(t) as an ON-OFF keyed signal, having its amplitude controllably varied between a prescribed amplitude excursion range of Amax and Amin.

The output of the VGA stage 40 is coupled to a first input 61 of a baseband modulator/multiplier stage 60, a second input 62 of which is coupled to receive a baseband amplitude modulation signal Vam(t). As a non-limiting example, the baseband modulation signal Vam(t) may comprise an ON-OFF keyed signal, such as that shown in FIG. 3, having its amplitude controllably varied in an on/off manner between extreme ends of a prescribed amplitude excursion range Amax and Amin. Baseband modulator stage 60 has its output 63 coupled to an RF power amplifier 70, the output of which drives an output load, such as an acousto-optic modulator 80.

The output of the VGA stage 40 is further coupled by way of a directional coupler 45 to an RF power detector circuit 90, such as a commercially available RF power detector integrated circuit (IC), which outputs a value representative of the power of the RF carrier signal being supplied to the baseband modulator 60, so as establish the instantaneous power level at a maximum output on-level. This monitored RF power value is coupled to the microcontroller 50, and is used in conjunction with the baseband modulation signal Vam(t) to controllably constrain the RF output power delivered to the load 80, as will be described.

The baseband signal Vam(t) that is applied to the baseband input 62 of modulator 60 is further coupled to a precision dual or 'ping-pong' integrator unit 100. This dual integrator unit is operative to integrate the baseband modulation signal over a prescribed integration interval ($\tau$), in order to determine the fractional on-time (See E.12 for ON-OFF keyed signal example) of the baseband signal Vam(t). As pointed out above, the use of a pair of precision integrators within the integrator unit 100, whose integration and reset times are controlled by the microcontroller 50 allows ping-pong operation, so as to assure continuous monitoring of the fractional on-time, and provides a pulse width and duty cycle insensitive mechanism for measuring the on-time of the modulation waveform.

The output level from the RF power detector 90 is digitized by microcontroller 50, which may employ a prescribed number of most significant bits to establish an appropriate on-time threshold under which safe output conditions are allowable. The values for these thresholds may be stored in a resident EEPROM within the microcontroller, and are compared to the average value of the digitized provided from the dual integrator unit 100.

Knowing the nominal parameters of the baseband modulation signal Vam(t), microcontroller 50 determines from the integrated output from the integrator unit 100 the average on-time of the baseband signal Vam(t). Whenever the allowable on-time threshold i-s exceeded for a given RF level, the microcontroller takes the appropriate action to either reduce the amplifier gain or inhibit the baseband modulation input.

Namely, as described previously, for a given on-time of the baseband modulation signal Vam(t), there is an associated maximum RF carrier power that can safely be delivered to the load, assuming that the maximum RF carrier power is applied to the load for the entirety of the on-time of the baseband modulation signal Vam(t) The greater the fractional on-time of the baseband modulation signal Vam(t), the smaller the value of RF power that can be applied to the load during this on-time interval without causing damage or degradation of its properties. Conversely, where the fractional on-time of the amplitude modulation signal Vam(t) is relatively short (e.g., a very narrow RF pulse), then the load is able to handle a much higher value of RF power.

As noted above, the issue is not peak RF power, but total energy. An RF load device, such as an acousto-optic modulator, can customarily handle a very narrow pulse (e.g., an on-time of only several nanoseconds) of large peak RF power, whereas applying such as large value of RF power applied to the load over a longer period of time would entail the application of a relatively large average amount and therefore destructive value of energy. In order to ensure that the load is never presented with an unacceptably large quantity of energy, the present invention establishes the peak RF power in accordance with the fractional on-time, or more generally the time average modulator gain, produced by the baseband signal as measured by the integrator unit 100. In accordance with the invention, microcontroller 50 may control the magnitude of the RF carrier, such as by reducing RF amplifier gain, controlling the setting of the variable gain stage 40, or inhibiting the input to the amplitude modulator 60, so that the peak power is no greater than the threshold associated with the detected average gain of the modulator, as determined by the dual integrator unit 100. In this manner, the invention ensures that the load/modulator 80 will never be presented with a potentially destructive amount of RF energy, irrespective of the amplitude of the RF carrier input.

As will be appreciated from the foregoing description, by performing measurements on the RF and baseband modulation signal transport paths, the pre-modulation protection circuit of the invention is able to limit the total output RF energy delivered to a load such as an acousto-optic modulator, in a manner that is fundamentally insensitive to RF pulse duration on-time and duty cycle, while permitting the use of low cost monolithic RF detector integrated circuits.

While we have shown and described an embodiment in accordance with the present invention, it is to be understood that the same is not limited thereto but is susceptible to numerous changes and modifications as known to a person skilled in the art. We therefore do not wish to be limited to the details shown and described herein, but intend to cover all such changes and modifications as are obvious to one of ordinary skill in the art.

What is claimed:

1. A method of supplying RF energy to a load comprising the steps of:

(a) modulating RF input power in accordance with a modulation signal to produce modulated RF output power;

(b) determining an average modulator gain produced by said modulation signal; and (c) constraining the product of said average modulator gain produced by said modulation signal and said RF input power to realize no more than a prescribed value of said RF energy.

2. The method according to claim 1, wherein step (c) comprises adjusting the magnitude of said RF input power to produce an adjusted RF input power, so that the product of said average modulator gain produced by said modulation signal and said adjusted RF input power constrains RF energy supplied to said load to no more than said prescribed value of said RF energy.

3. The method according to claim 1, wherein step (c) comprises adjusting the average modulator gain produced by said modulation signal, so that the product of said modulator gain produced by said modulation signal and said RF input power constrains RF energy supplied to said load to no more than said prescribed value of said RF energy.

4. The method according to claim 1, wherein step (b) comprises integrating said modulation signal to derive a measure of the average modulator gain produced by said modulation signal.

5. The method according to claim 4, wherein step (b) comprises integrating said modulation signal during alternate time intervals to derive alternate measures of said average modulator gain produced by said modulation signal, and constraining successive products of said RF input power and said alternate measures of average modulator gain produced by said modulation signal to realize no more than a prescribed value of said RF energy.

6. A method of controlling the operation of an acousto-optic modulator containing an acousto-optic medium, that is configured to modulate an optical input in accordance with an RF signal supplied to an acoustic modulator coupled to said acousto-optic medium, comprising the steps of:

(a) modulating RF input power in accordance with an amplitude modulation signal to produce am amplitude modulated RF signal that is supplied to said acoustic modulator;

(b) determining an average modulator gain produced by said amplitude modulation signal; and (c) constraining the product of said average modulator gain produced by said amplitude modulation signal and said RF input power to realize no more than a prescribed value of RF energy supplied to said acousto-optic modulator.

7. The method according to claim 6, wherein step (c) comprises adjusting the magnitude of said RF input power to produce an adjusted RF input power, so that the product of said average modulator gain produced by said amplitude modulation signal and said adjusted RF input power constrains RF energy supplied to said acousto-optic modulator to no more than said prescribed value of said RF energy.

8. The method according to claim 6, wherein step (c) comprises adjusting the average modulator gain produced by said amplitude modulation signal, so that the product of said average modulator gain produced by said amplitude modulation signal and said RF input power constrains RF energy supplied to said acousto-optic modulator to no more than said prescribed value of said RF energy.

9. An apparatus for supplying RF energy to a load comprising:

a modulator that is operative to modulate RF input power in accordance with a modulation signal to produce modulated RF output power;

a signal processor that is operative to determine an average modulator gain produced by said modulation signal; and an RF power controller, that is operative to constrain the product of said average modulator gain produced by said modulation signal and said RF input power to realize no more than a prescribed value of said RF energy supplied to said load.

10. The apparatus according to claim 9, wherein said RF power controller is operative to adjust the magnitude of said RF input power to produce an adjusted RF input power, so that the product of said average modulator gain produced by said modulation signal and said adjusted RF input power causes RF energy supplied to said load to be constrained to no more than said prescribed value of said RF energy.

11. The apparatus according to claim 9, wherein said RF power controller is operative to adjust the average modulator gain produced by said modulation signal, so that the product of said average modulator gain produced by said modulation signal and said RF input power constrains RF energy supplied to said load to no more than said prescribed value of said RF energy.

12. The apparatus according to claim 9, wherein said signal processor is operative to integrate said modulation signal to derive a measure of said average modulator gain produced by said modulation signal.

13. The apparatus according to claim 12, wherein said signal processor comprises alternate integration paths that are operative to integrate said modulation signal during alternate time intervals to derive alternate measures of said average modulator gain produced by said modulation signal, and wherein said RF power controller is operative to constrain successive products of said RF input power and said alternate measures of average modulator gain produced by said modulation signal to realize no more than a prescribed value of said RF energy.

14. An apparatus according to claim 9, wherein said load comprises an acousto-optic modulator containing an acousto-optic medium that is configured to modulate an optical input in accordance with said RF energy.

* * * * *

UNITED STATES PATENT AND TRADEMARK OFFICE
CERTIFICATE OF CORRECTION

PATENT NO.        : 6,870,658 B2
APPLICATION NO.   : 10/462552
DATED             : March 22, 2005
INVENTOR(S)       : Peter Alan Wasilousky, Robert Morris Montomery and Pat O. Bentley It is certified that error appears in the above-identified patent and that said Letters Patent is hereby corrected as shown below:

Column 2, Line 32

Delete: "$V_o = -\frac{Av}{\tau_o} \cdot \int_0^\tau V_{AM}(t)dt = C1 \cdot \int_0^\tau V_{AM} dt$"

Insert: -- $V_o = -\frac{Av}{\tau_o} \cdot \int_0^\tau V_{AM}(t)dt = C1 \cdot \int_0^\tau V_{AM}(t)dt$ --

Column 2, Line 60

Delete:
"$P_{avc} = G_A \cdot G_V \cdot P_{in} \cdot \frac{1}{\tau} \int_0^\tau G_M(t)dt = G_A \cdot G_V \cdot P_{in} \cdot \langle G_M(t) \rangle$"

Insert:--
$P_{avc} = G_A \cdot G_V \cdot P_{in} \cdot \frac{1}{\tau} \int_0^\tau G_M(t)dt = G_A \cdot G_V \cdot P_{in} \cdot \langle G_M(t) \rangle$ --

Column 2, Line 64

Delete: "and <G$_M$(t)>"

Insert: --and $\langle G_M(t) \rangle$ --

Column 3, Line 62

Delete: "so as establish"

Insert: --so as to establish--

Column 6, line 8

Delete: "i-s exceeded"
Insert: --is exceeded--

UNITED STATES PATENT AND TRADEMARK OFFICE
CERTIFICATE OF CORRECTION

PATENT NO. : 6,870,658 B2
APPLICATION NO. : 10/462552
DATED : March 22, 2005
INVENTOR(S) : Peter Alan Wasilousky, Robert Morris Montomery and Pat O.Bentley It is certified that error appears in the above-identified patent and that said Letters Patent is hereby corrected as shown below:

Column 6, line 16    Delete "Vam(t) The"
                     Insert: -- Vam(t). The --

Signed and Sealed this

Twenty-ninth Day of August, 2006

JON W. DUDAS
*Director of the United States Patent and Trademark Office*